(12) United States Patent
Wu et al.

(10) Patent No.: US 12,376,282 B2
(45) Date of Patent: Jul. 29, 2025

(54) SEMICONDUCTOR STRUCTURE AND METHOD FOR MANUFACTURING SAME

(71) Applicant: CHANGXIN MEMORY TECHNOLOGIES, INC., Hefei (CN)

(72) Inventors: Runping Wu, Hefei (CN); Jun Zhang, Hefei (CN); Taegyun Kim, Hefei (CN); Daejoong Won, Hefei (CN); Soonbyung Park, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 547 days.

(21) Appl. No.: 17/805,042

(22) Filed: Jun. 2, 2022

(65) Prior Publication Data

US 2023/0276610 A1    Aug. 31, 2023

Related U.S. Application Data

(63) Continuation of application No. PCT/CN2022/080152, filed on Mar. 10, 2022.

(30) Foreign Application Priority Data

Feb. 28, 2022   (CN) .......................... 202210186665.0

(51) Int. Cl.
*H10B 12/00* (2023.01)
*H01L 21/3213* (2006.01)

(52) U.S. Cl.
CPC ......... *H10B 12/053* (2023.02); *H10B 12/488* (2023.02); *H01L 21/32133* (2013.01)

(58) Field of Classification Search
None
See application file for complete search history.

(56) References Cited

U.S. PATENT DOCUMENTS

| 8,263,460 B2 | 9/2012 | Kim |
| 9,236,439 B2 | 1/2016 | Jeong |
| 11,315,930 B2 | 4/2022 | Huang |
| 2008/0124931 A1* | 5/2008 | Lee .................... H01L 21/76816 |
| | | 438/692 |
| 2008/0146002 A1* | 6/2008 | Kang .................. H10B 12/053 |
| | | 257/E21.624 |

(Continued)

FOREIGN PATENT DOCUMENTS

| CN | 102214578 A | 10/2011 |
| CN | 110911281 A | 3/2020 |

(Continued)

OTHER PUBLICATIONS

English translation of CN-113539942-A (Year: 2021).*

*Primary Examiner* — Khaja Ahmad
(74) *Attorney, Agent, or Firm* — Syncoda LLC; Feng Ma

(57) ABSTRACT

A method for manufacturing a semiconductor structure includes: forming multiple trenches spaced apart from each other and extending in a first direction in a substrate, and forming a first insulating layer on sidewalls and bottoms of the trenches; forming a first conductive layer on a surface of the first insulating layer; removing part of the first conductive layer to an initial depth by a first etching process; removing remaining part of the first conductive layer to a target depth by a second etching process.

18 Claims, 16 Drawing Sheets

(56) References Cited

U.S. PATENT DOCUMENTS

| | | | |
|---|---|---|---|
| 2011/0003468 A1* | 1/2011 | Song | H10D 64/513 |
| | | | 438/589 |
| 2011/0248339 A1 | 10/2011 | Kim | |
| 2012/0012925 A1 | 1/2012 | Oh | |
| 2012/0306008 A1 | 12/2012 | Kim | |
| 2015/0187899 A1 | 7/2015 | Jeong | |
| 2016/0093710 A1 | 3/2016 | Jeong | |
| 2019/0267386 A1* | 8/2019 | Lee | H10B 12/053 |
| 2019/0296017 A1* | 9/2019 | Cho | H01L 27/1203 |
| 2019/0393320 A1* | 12/2019 | Yoo | H01L 21/28061 |
| 2021/0257372 A1 | 8/2021 | Huang et al. | |
| 2022/0216213 A1 | 7/2022 | Huang et al. | |
| 2022/0359717 A1* | 11/2022 | Chang | H01L 29/66795 |
| 2023/0014156 A1* | 1/2023 | Su | H01L 21/76832 |

FOREIGN PATENT DOCUMENTS

| | | | |
|---|---|---|---|
| CN | 112885897 A | | 6/2021 |
| CN | 113270406 A | | 8/2021 |
| CN | 113539942 A | * | 10/2021 |

\* cited by examiner

SEMICONDUCTOR STRUCTURE AND METHOD FOR MANUFACTURING SAME

CROSS-REFERENCE TO RELATED APPLICATIONS

The present application is a U.S. continuation application of International Application No. PCT/CN2022/080152 filed on Mar. 10, 2022, which claims priority to Chinese Patent Application No. 202210186665.0 filed on Feb. 28, 2022. These applications are hereby incorporated by reference in their entirety.

BACKGROUND

With the development of semiconductor technology, the application of semiconductor structure becomes increasingly extensive. Especially, a dynamic random access memory (DRAM) is widely used in various electronic devices because of its high storage density and high speed read/write.

A dynamic random access memory typically includes multiple memory cells, each of which includes a transistor and a capacitor. The gate of the transistor is electrically connected to a word line (WL). One of the source and drain of the transistor is electrically connected to a bit line (BL), and the other is electrically connected to a capacitor.

In order to improve the integration level of a DRAM, the DRAM usually uses a buried word line (BWL). The BWL is formed inside the substrate and intersects with active areas of the substrate so that part of the word line can be used for a gate of the transistor, and the source-drain area of the transistor is formed in the substrate on both sides of the gate. However, the semiconductor structures described above are often prone to occur the phenomenon of gate induced drain leakage (GIDL), so that the yield of semiconductor structure is low.

SUMMARY

According to some embodiments, in the first aspect, the disclosure provides a method for manufacturing a semiconductor structure. The method includes: forming multiple trenches spaced apart from each other and extending in a first direction in a substrate, and forming a first insulating layer on sidewalls and bottoms of the trenches;
  forming a first conductive layer on a surface of the first insulating layer;
  removing part of the first conductive layer to an initial depth by a first etching process;
  removing remaining part of the first conductive layer to a target depth by a second etching process.

According to some embodiments, in the second aspect, embodiments of the present disclosure provide a semiconductor structure which is formed by the above-described manufacturing method.

DETAILED DESCRIPTION

The present disclosure relates to the technical field of semiconductor, and in particular to a semiconductor structure and a method for manufacturing the same.

As described in the Background, semiconductor structures are often prone to occurrence of the phenomenon of gate induced drain leakage, and the yield of semiconductor structures is low. After studying, the inventors found, the reason is that when forming embedded word lines, trenches are often formed in the substrate, a first insulating layer is formed on the sidewalls and bottoms of the trenches, and part of the first insulating layer can be used as a gate dielectric layer; next, a first conductive layer is formed in the area enclosed by the first insulating layer, and the first conductive layer is etched to a target depth by one dry etching. while the first conductive layer is etched by the dry etching process, the exposed first insulating layer is often damaged greatly, the thickness of the first insulating layer above the remaining first conductive layer is reduced, and the thickness of the gate dielectric layer formed by the part of the first insulating layer is thin, so that when the second conductive layer is formed subsequently, the insulation between the second conductive layer and the substrate is weak, and the gate induced drain leakage phenomenon is prone to occur.

In view of this, embodiments of the present disclosure provide a method for manufacturing a semiconductor structure. In the method, the first conductive layer is removed to a target depth through at least two etching processes, and the first etching process and/or the second etching process are controlled. By doing so, the damage to the first insulating layer can be reduced while etching the first conductive layer, thereby ensuring the thickness of the first insulating layer, and reducing or avoiding the gate induced drain leakage current phenomenon, thus improving the yield of semiconductor structure.

In order to explain the above objects, features and advantages of the embodiment of the present disclosure more obvious and understandable, a clear and complete description of the technical solutions of the embodiments of the disclosure will be provided below with reference to the accompanying drawings in the embodiments of the disclosure. It is apparent that the described embodiments are only a part of the embodiments of the disclosure, not all of them. Based on the embodiments in the disclosure, any other embodiments obtained by those of ordinary skill in the art without making creative effort falls within the scope of protection of the disclosure.

Figure 1:
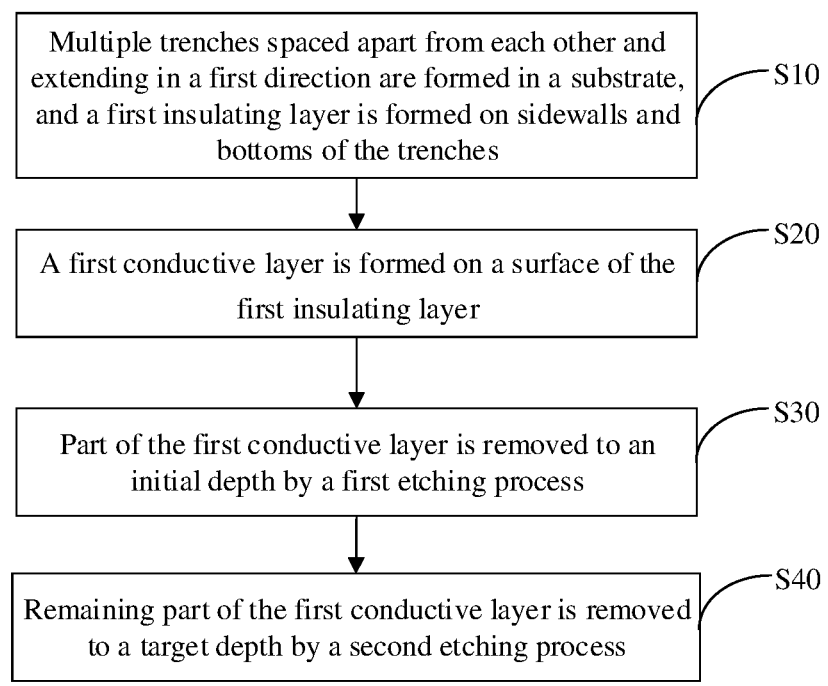
FIG. 1 illustrates a flow chart of a method for manufacturing a semiconductor structure provided by an embodiment of the present disclosure.

Referring to FIG. 1, an embodiment of the present disclosure provides a method for manufacturing a semiconductor structure. The method includes the following operations.

At S10, multiple trenches spaced apart from each other and extending in a first direction are formed in a substrate, and a first insulating layer is formed on sidewalls and bottoms of the trenches.

Figure 2:
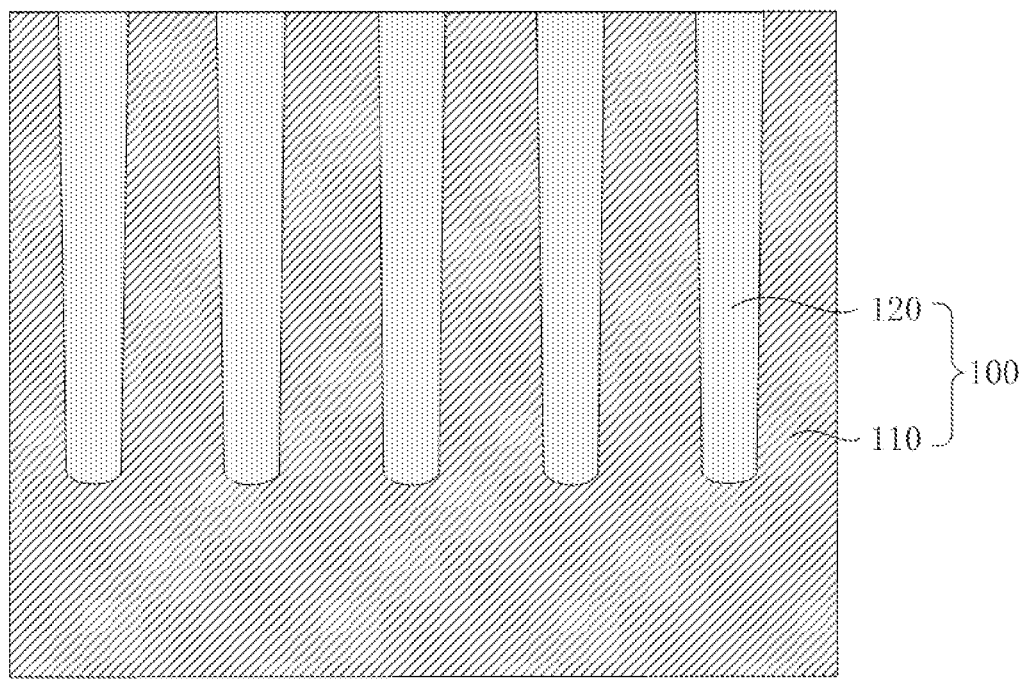
FIG. 2 illustrates a schematic cross-sectional diagram of a substrate provided by an embodiment of the present disclosure.

Referring to FIG. 2, the substrate 100 supports film layers thereon. The substrate 100 may be a semiconductor substrate. As an example, the substrate 100 may be a silicon substrate, a germanium substrate, a silicon carbide (SiC) substrate, a silicon germanium (SiGe) substrate, a germanium on insulator (GOI) substrate or silicon on insulator (SOI) substrate, and the like.

As shown in FIG. 2, the substrate 100 includes multiple active areas (AAs) 110. The multiple active areas 110 are spaced apart from each other. In some possible embodiments, shallow trench isolation (STI) structures 120 may be provided between the multiple active areas 110, by which the multiple of active areas 110 are separated to ensure that independency of each of the active areas 110.

As an example, shallow trenches are formed in the substrate 100 by a patterning process, and an insulating material fills the shallow trenches, thereby defining multiple active areas 110 separated by the shallow trench isolation structures 120 on the substrate 100. The patterning process may be the self-aligned double patterning (SADP) process or the self-aligned quadruple patterning (SAQP) process. The depth of the shallow trenches may be 800 nm to 1600 nm. The dielectric constant of the insulating material may be less than 3 to reduce electrical coupling. For example, the insulating material may be silicon oxide.

Specifically, a second insulating layer may be formed on the surface of the substrate 100 by a thermal oxidation process or the like. The material of the second insulating layer may be an oxide, so as to protect the active areas 110 formed in a subsequent operation and to avoid the active areas 110 from pollution during the removal of a hard mask layer in a subsequent operation. The hard mask layer is then formed on the second insulating layer. The material of the hard mask layer may be a nitride. A first photo resist (PR) layer is coated on the hard mask layer. The hard mask layer, the second insulating layer and the substrate 100 are then etched by taking the first photo resist layer as a mask to form shallow trenches and active areas 110 in the substrate 100. Next, an oxide layer is formed on the sidewalls of the shallow trenches to improve the interface properties between the active areas 110 and the insulating material, and the insulating material fills in the shallow trenches by depositing. The nitride layer is then removed by a planarization process which will also remove the insulating material on the nitride layer in case an insulating material is deposited on the nitride layer.

The multiple active areas 110 may extend in a second direction. The second direction is not perpendicular to the first direction, i.e. the second direction is arranged obliquely with respect to the first direction so that the subsequently formed trenches intersect with the active areas 110, thereby dividing the active areas 110 into multiple partitions to serve as source/drain of the transistors. As an example, the cross-section of an active area 110, being parallel to the substrate 100, may be in a shape of parallelogram whose centerline is parallel to the second direction. The multiple active areas 110 may be arranged in an array. For example, the center points of the multiple active areas 110 may be arranged in a dot array.

Figure 3:
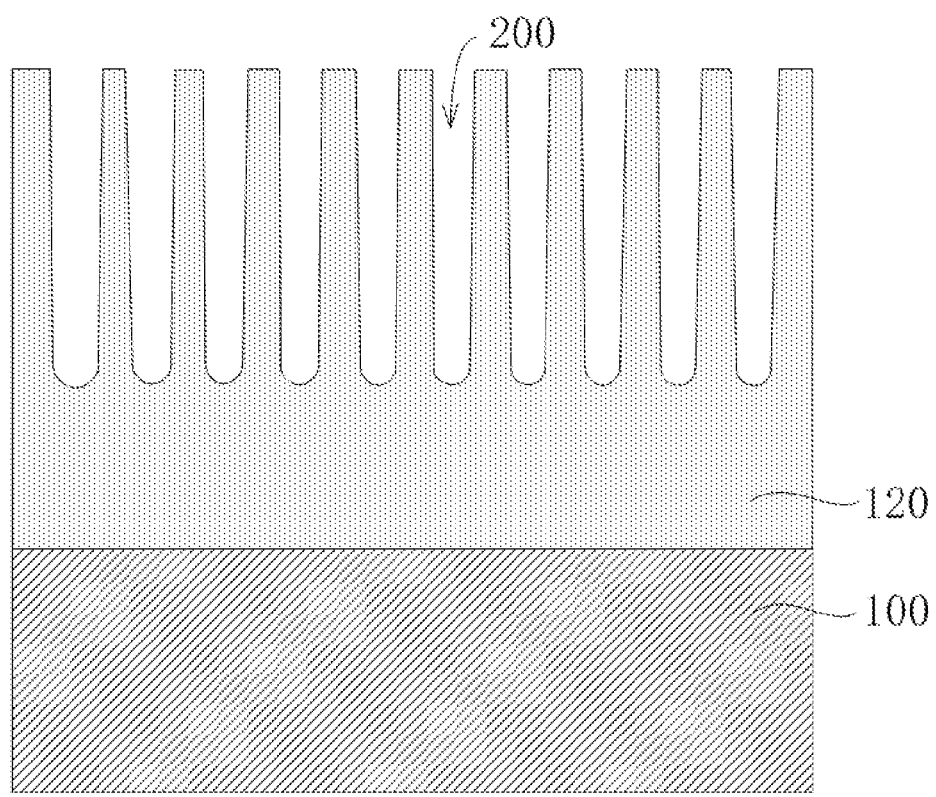
FIG. 3 illustrates a schematic cross-sectional diagram of a semiconductor structure after forming trenches provided by an embodiment of the present disclosure.
Figure 4:
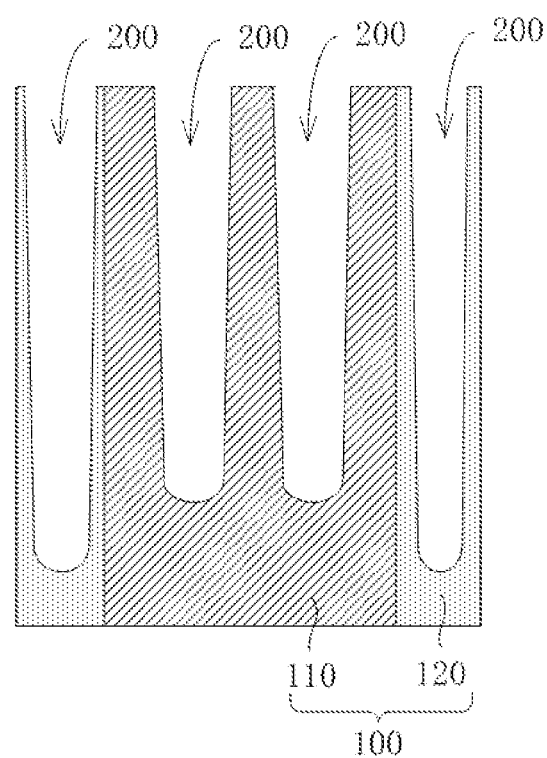
FIG. 4 illustrates another schematic cross-sectional diagram of a semiconductor structure after forming trenches provided by an embodiment of the present disclosure.

Referring to FIGS. 3 and 4, the cross-sections shown in FIG. 3 and FIG. 4 are parallel, and they are parallel to the second direction. The cross-section shown in FIG. 3 does not pass through the active area 110, and the cross-section shown in FIG. 4 passes through the active area 110. A trench 200 is formed in the substrate 100, and there may be multiple trenches 200. The multiple trenches 200 are spaced apart from each other so that word lines subsequently formed trenches 200 have a certain space.

The multiple trenches 200 extend in the first direction. The angle between the first direction and the second direction may be 15 to 60 degree. The depth of the trenches 200 is less than the depth of the shallow trench isolation structure 120. A trench 200 divides the active area 110 into a first contact area and a second contact area which are respectively located at two sides of the trench 200. One of the first and second contact areas is electrically connected to the bit lines, and the other of the first and second contact areas is electrically connected to the capacitors.

In some possible embodiments, one only trench 200 passes through one active area 110, that is, the active area 110 is divided into left and right parts by the trench 200, one of the left and right parts being the first contact area and the other being the second contact area. For example, the left part is the first contact area that is connected to a bit line. The right part is the second contact area that is connected to a capacitor.

In other possible embodiments, two trenches 200 pass through one active area 110, that is, the active area 110 is divided by the trenches 200 into left, middle and right parts. The middle part of the three parts is one contact area, and the other two parts is another contact area. For example, the middle part is the first contact area that is connected to a bit line. Both the left and right parts are the second contact area that is connected with a capacitor. With this arrangement, two capacitors can be controlled by one active area 110, which can improve the integration level of the semiconductor structure and the storage density of the semiconductor structure.

In the above implementation ways, active areas 110 located in the same row along the second direction are typically arranged in an alternative way with adjacent active areas 110 located in the same row along the second direction. As a result, for each active area 110 of the multiple active areas 110 located in the same row along the second direction, two trenches 200 pass through it, so as to divide each active area 110 into the above-described three parts. For a shallow trench isolation structure 120 between two adjacent active areas 110 in the row, one trench 200 passes through it, and this trench 200 together with an adjacent trench 200 passing through the active area 110 divide active areas 110 in other rows into the above-described three parts.

In some possible embodiments, the operation that multiple trenches 200 spaced apart from each other and extending in a first direction are formed in a substrate 100 and a first insulating layer 300 is formed on sidewalls and bottoms of the trenches 200 includes following processes.

The active areas 110 and the shallow trench isolation structures 120 are etched to form the trenches 200. Referring to FIGS. 3 and 4, the active areas 110 and the shallow trench isolation structures 120 are etched by a dry etching process or other anisotropic etching processes to form desired trenches 200. The cross-sectional of the trenches 200, being perpendicular to the first direction, may be in a shape of quadrilateral such as a rectangle, a trapezoid and the like. Of course, the sidewalls and the bottoms of the trenches 200 may also have round transitions.

Each trench 200 is located partly in an active area 110 and partly in a shallow trench isolation structure 120. These two parts may be alternately arranged in turn, i.e. each trench 200 alternately passes through the active area 110 and the shallow trench isolation structure 120 in turn along the first direction. The structure subsequently formed in the trench 200 located in the active areas 110 is a gate structure. The depth of the trench 200 is less than the height of the active area 110 such that a portion of the trench bottom of the trench 200 is located in the active area 110.

It is to be understood that during the etching of the active area 110 and the shallow trench isolation structures 120, the material of the active areas 110 is different from the material of the shallow trench isolation structures 120, so that the etching rates of them are different. As a result, the depth of the part of the trench 200 located in the active area 110 is different from the depth of the part of the trench 200 located in the shallow trench isolation structure 120. For example, as shown in FIG. 4, where the material of the active area 110 is silicon and the material of the shallow trench isolation structure 120 is silicon oxide, the depth of the part of the trench 200 located in the active area 110 is less than the depth of the part of the trench 200 located in the shallow trench isolation structure 120, that is, the trench 200 in the shallow trench isolation structure 120 may be deeper.

As an example, the trenches 200 may be formed by the following processes. A mask layer is formed on the substrate 100. A second photoresist layer having a pattern is formed on the mask layer. The mask layer and the substrate 100 are etched by taking the second photoresist layer as a mask to form trenches 200 in the active areas 110 and the shallow trench isolation structures 120 of the substrate 100. The mask layer and the second photoresist layer are then removed. The desired trenches 200 are formed by transferring the pattern of the second photoresist layer into the substrate 100.

Figure 5:
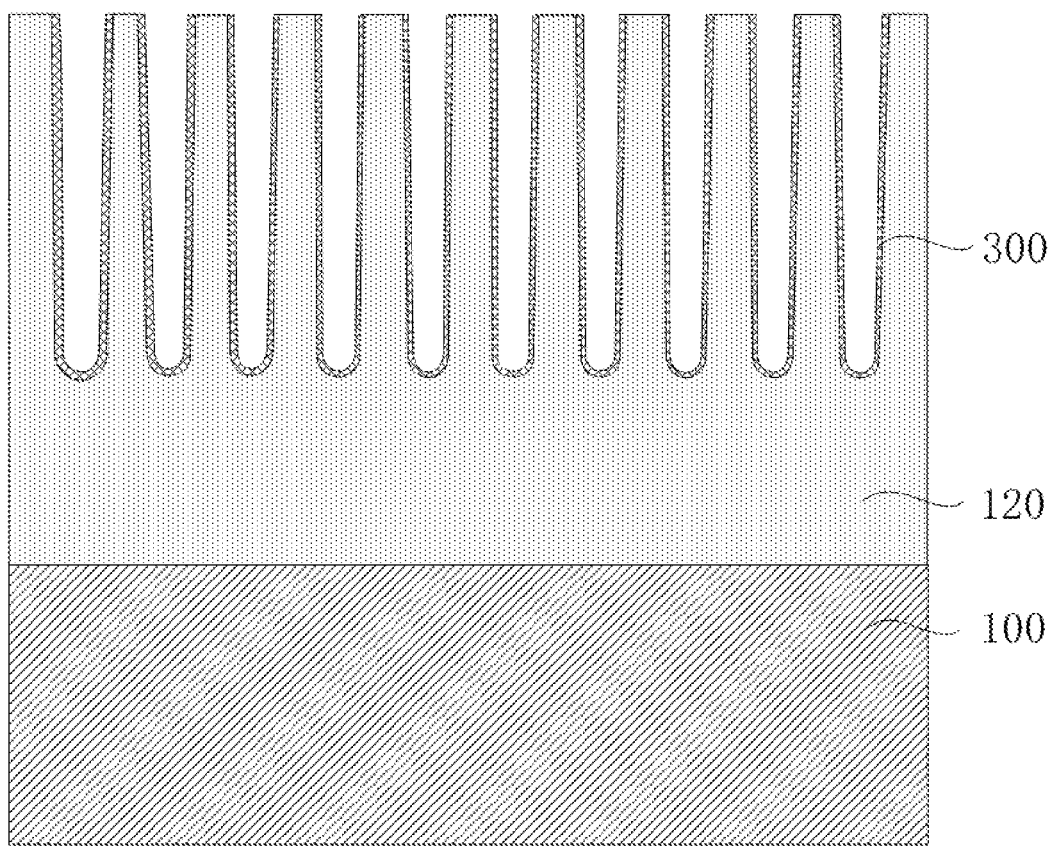
FIG. 5 illustrates a schematic cross-sectional diagram of a semiconductor structure after forming a first insulating layer provided by an embodiment of the present disclosure.
Figure 6:
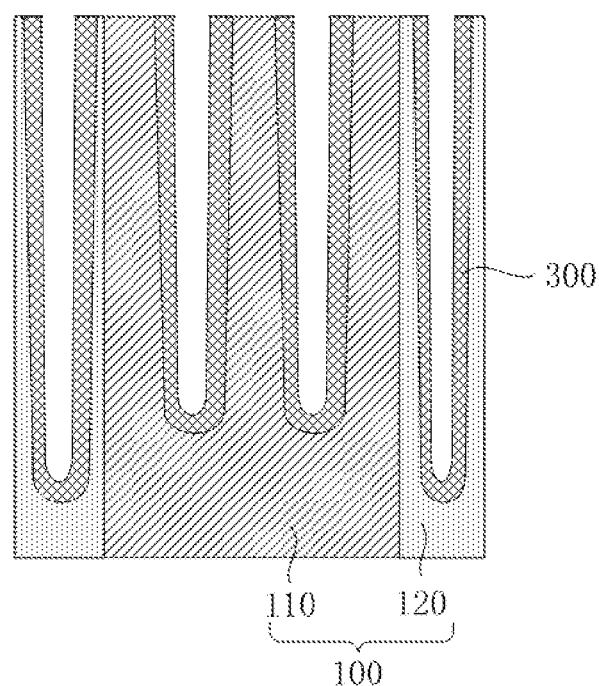
FIG. 6 illustrates another schematic cross-sectional diagram of a semiconductor structure after forming a first insulating layer provided by an embodiment of the present disclosure.

After the trenches 200 are formed, a first insulating layer 300 is deposited on sidewalls and bottoms of the trenches 200. Referring to FIGS. 5 and 6, the first insulating layer 300 is formed on the sidewalls and bottoms of the trenches 200 by a deposition process and part of the first insulating layer 300 may be used as a gate dielectric layer. Specifically, the part of the first insulating layer 300 in contact with the active area 110 serves as a gate dielectric layer for isolating the active area 110 and the structures formed in the area enclosed by the first insulating layer 300. For example, the structure may include a first conductive layer 400, a second conductive layer 500 and a protective layer 600 which are subsequently formed (referring to FIGS. 15 and 16). The deposition process may be chemical vapor deposition (CVD), physical vapor deposition (PVD) or atomic layer deposition (ALD), or the like.

The dielectric constant of the first insulating layer 300 may be 1-8. The material thereof the first insulating layer may include silicon nitride or silicon oxide. Certainly, the material of the first insulating layer 300 may also include a high dielectric constant material such as hafnium oxide (HfO). The thickness of the first insulating layer 300 may be 1 nm-8 nm. Preferably, the material of the first insulating layer 300 is the same as the insulating material in the shallow trench isolation structures 120. The first insulating layer 300 is in contact with the shallow trench isolation structures 120 such that interlayer separation between the first insulating layer 300 and the shallow trench isolation structures 120 is not prone to occur.

At S20, a first conductive layer is formed on the surface of the first insulating layer.

Figure 7:
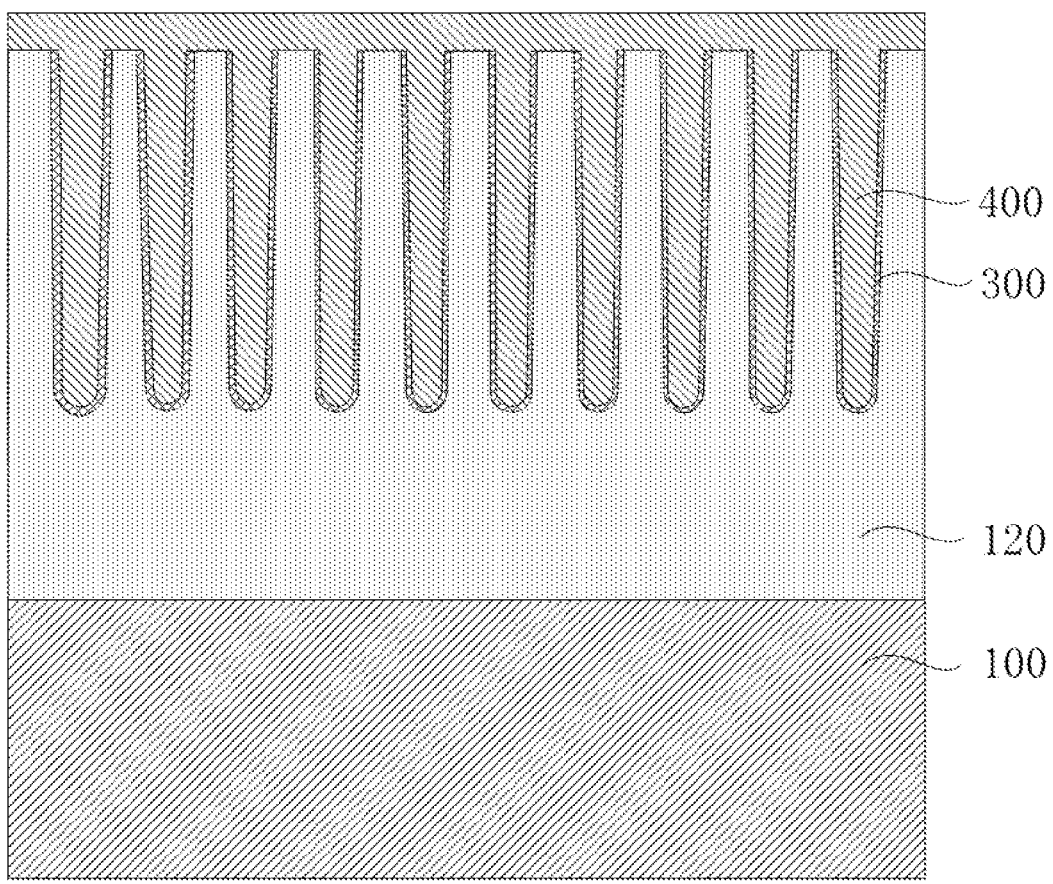
FIG. 7 illustrates a schematic cross-sectional diagram of a semiconductor structure after forming a first conductive layer provided by an embodiment of the present disclosure.
Figure 8:
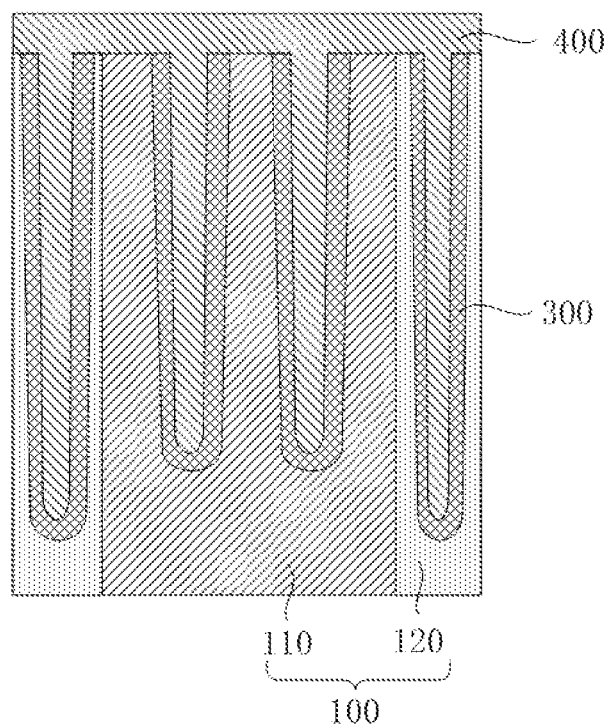
FIG. 8 illustrates another schematic cross-sectional diagram of a semiconductor structure after forming a first conductive layer provided by an embodiment of the present disclosure.

Referring to FIGS. 7 and 8, the first conductive layer 400 is formed on the surface of the first insulating layer 300. The first conductive layer covers the first insulating layer 300 and fills in the trenches 200 where the first insulating layer 300 is formed. As an example, after the trenches 200 are formed, the first insulating layer 300 covers the sidewalls and the bottoms of the trenches 200, and the first conductive layer 400 fills the areas enclosed by the first insulating layer 300, that is, the first insulating layer 300 and the first conductive layer 400 fill the trenches 200.

The first conductive layer 400 includes a metal conductive layer which may be a single layer or multiple layers. For example, the first conductive layer 400 may be a single-layer structure such as a titanium nitride layer, a molybdenum layer, a tungsten layer, a tungsten nitride layer, a tantalum nitride layer, a titanium nitride silicon compound layer, a tantalum nitride silicon compound layer, a tungsten nitride silicon compound layer or the like. The first conductive layer 400 may also include a first conductive sub-layer formed on the surface of the first insulating layer 300 and a second conductive sub-layer filled in an area enclosed by the first conductive sub-layer. As an example, the second conductive sub-layer may be a tungsten pillar, and the first conductive layer may be a titanium nitride layer. The first conductive sub-layer is located between the second conductive sub-layer and the first insulating layer 300 to block diffusion of the metal of the second conductive sub-layer into the first insulating layer 300, or even the substrate 100. Various layers of the first conductive layer 400 may be formed by chemical vapor deposition or atomic layer deposition.

In some possible embodiments, the operation that a first conductive layer is formed on the surface of the first insulating layer includes: the first conductive layer 400 is deposited on the surface of the first insulating layer 300 and the substrate 100. The first conductive layer 400 fills the trenches 200 where the first insulating layer 300 is formed and covers the substrate 100. Referring to FIGS. 7 and 8, the first conductive layer 400 fills the remaining space of the trenches 200 after the first insulating layer 300 is formed, and covers the substrate 100 to facilitate the formation of the first conductive layer 400 and subsequent processing of the first conductive layer 400.

In the above-described embodiment where a second insulating layer is formed on the substrate 100, the active areas 110 can be isolated and protected by the second insulating layer. The first conductive layer 400 fills the trenches 200 and covers the second insulating layer. The first conductive layer is isolated from the active areas 110 by the second insulating layer. On the one hand, the first conductive layer 400 can be prevented from being electrically connected with the active areas 110, and on the other hand, the active areas 110 can be protected during the removal of the first conductive layer 400 to reduce or avoid damage to the active areas 110.

At S30: part of the first conductive layer is removed to an initial depth by a first etching process.

Figure 9:
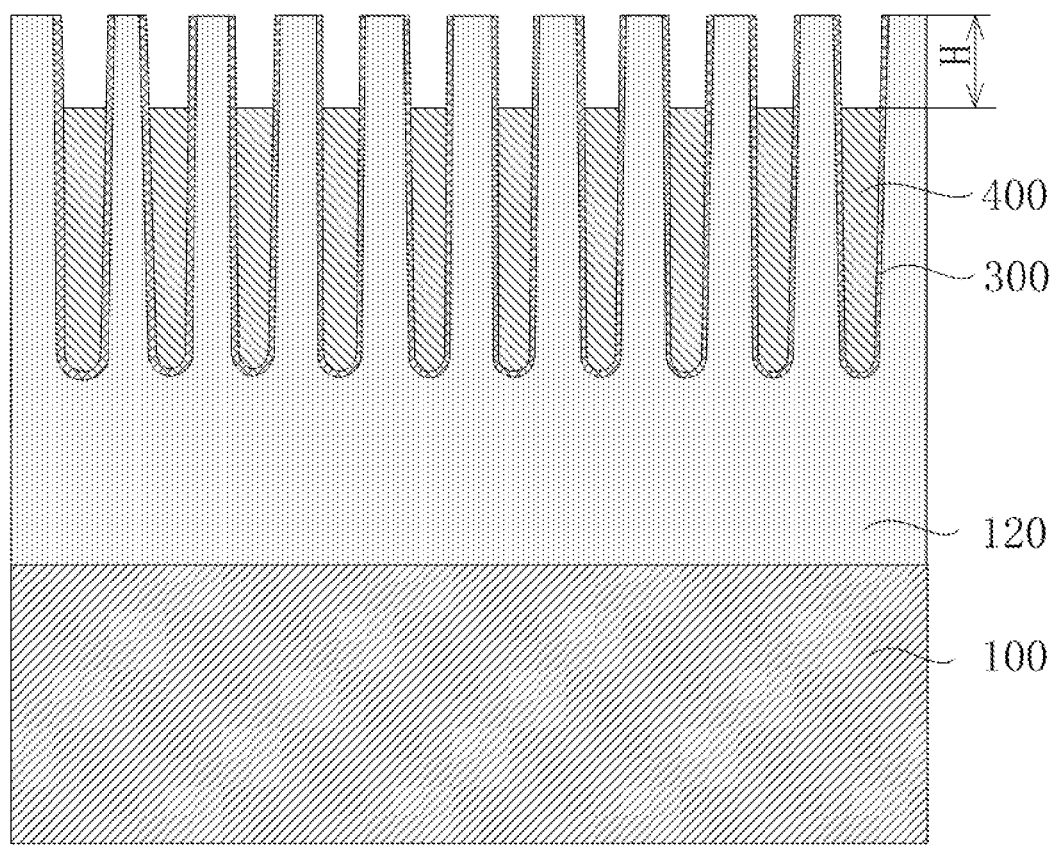
FIG. 9 illustrates a schematic cross-sectional diagram of a semiconductor structure after etching the first conductive layer by a first etching process provided by an embodiment of the present disclosure.
Figure 10:
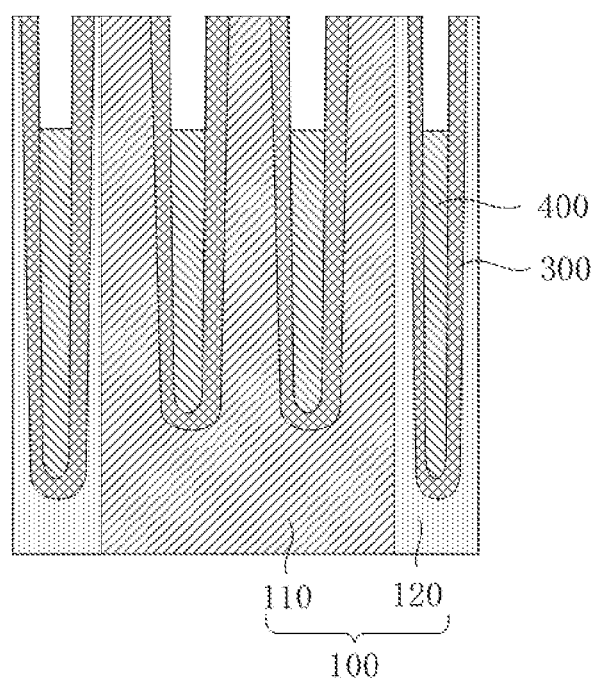
FIG. 10 illustrates another schematic cross-sectional diagram of a semiconductor structure after etching the first conductive layer by a first etching process provided by an embodiment of the present disclosure.

Referring to FIGS. 9 and 10, the first conductive layer 400 above the substrate 100 is removed by a first etching process, and part of the first conductive layer 400 located in the trenches 200 is removed, and part of the first conductive layer 400 located at the bottom of the trenches 200 is retained. After part of the first conductive layer 400 is removed, the remaining first conductive layer 400 is located at the initial depth of the trenches 200 as shown at H in FIG. 9.

The first etching process may be dry etching or wet etching. The first etching process may be one-shot etching or multiple etching. One-shot etching refers to one-step etching where the first conductive layer 400 is etched to an initial depth by one etching process. Multiple etching refers to multi-step etching or step-by-step etching where the first conductive layer 400 is etched to an initial depth by at least two etching processes. The at least two etching process are different in term of types and/or process parameters.

In some possible embodiments, the first etching process is dry etching and is one-shot etching. For example, the first conductive layer 400 is directly etched to an initial depth by plasma. With this arrangement, the etching process is a simple process without any additional procedure, and no adjustment of process parameters is needed.

In some other possible embodiments, the first etching process is dry etching and is multiple etching, that is, the first conductive layer 400 is etched to an initial depth by multiple dry etching processes. For example, the first conductive layer 400 is subjected to two dry etching processes to an initial depth, and the etching rates of the two dry etching processes may be different. Preferably, the etching rate of the second dry etching process is less than the etching rate of the first dry etching process. With this arrangement, with the increase of the etching depth of the first conductive layer 400, the etching rate of the etching process for the first conductive layer 400 decreases, so that the first conductive layer 400 is more accurately etched to the initial depth. As a result, over-etching of the first conductive layer 400 can be reduced or avoided.

In the embodiment that the first conductive layer 400 fills the trenches 200 where the first insulating layer 300 is formed and covers the substrate 100, the first etching process includes dry etching. The operation that part of the first conductive layer 400 is removed to an initial depth by a first etching process includes: the first conductive layer 400 is dry etched to completely remove the first conductive layer 400 on the substrate and to remove the first conductive layer 400 in the trenches to the initial depth. As shown in FIGS. 7-10, the part of the first conductive layer 400 at and below the initial depth is retained, and the remaining part of the first conductive layer 400 is removed. After the first conductive layer 400 is dry etched, the first conductive layer 400 becomes multiple strips, each of which is located in one trench 200.

In some possible embodiments, the first conductive layer 400 is dry etched. Where the first conductive layer 400 is a titanium nitride layer or a molybdenum layer, the etching gas may include a fluorine-containing gas, such as methane ($CF_4$), trifluoromethane ($CHF_3$), difluoromethane ($CH_2F_2$), or the like. Where the first conductive layer 400 is a molybdenum layer, the etching gas may also include a chlorine-containing gas, such as chlorine ($Cl_2$), carbon tetrachloride ($CCl_4$), etc.

At S40: remaining part of the first conductive layer is removed to a target depth by a second etching process.

Figure 11:
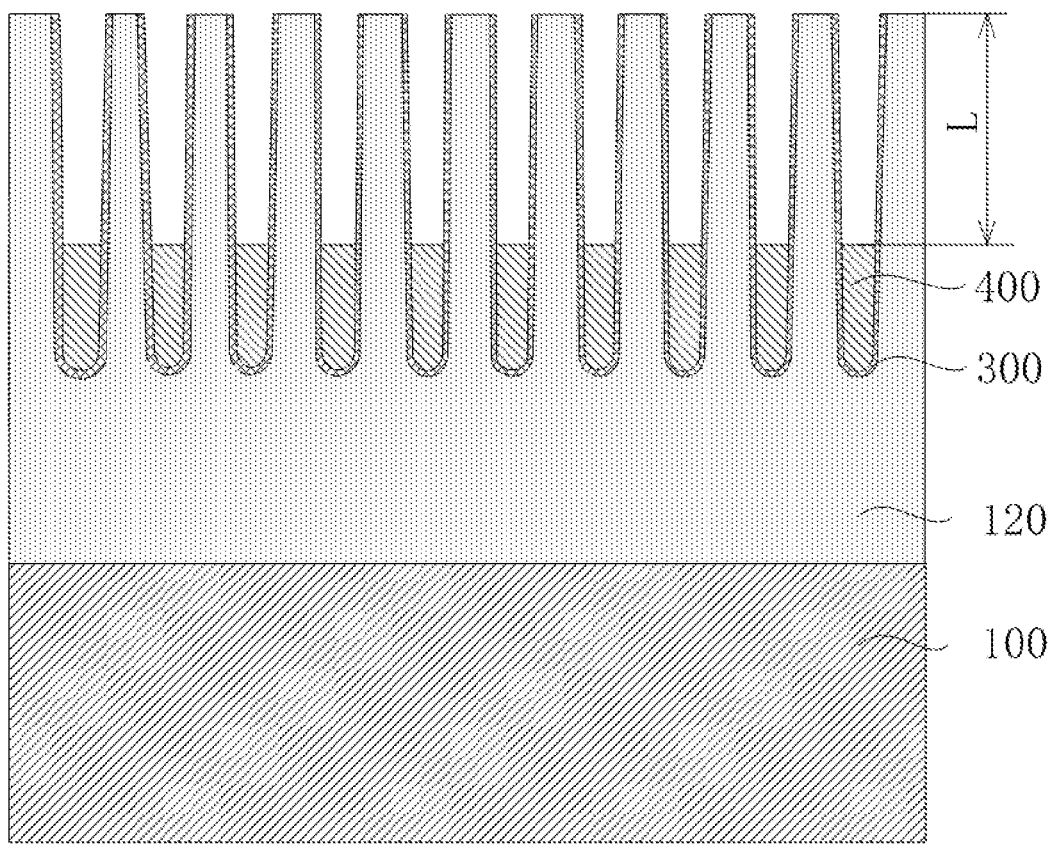
FIG. 11 illustrates a schematic cross-sectional diagram of a semiconductor structure after etching the second conductive layer by a second etching process provided by an embodiment of the present disclosure.
Figure 12:
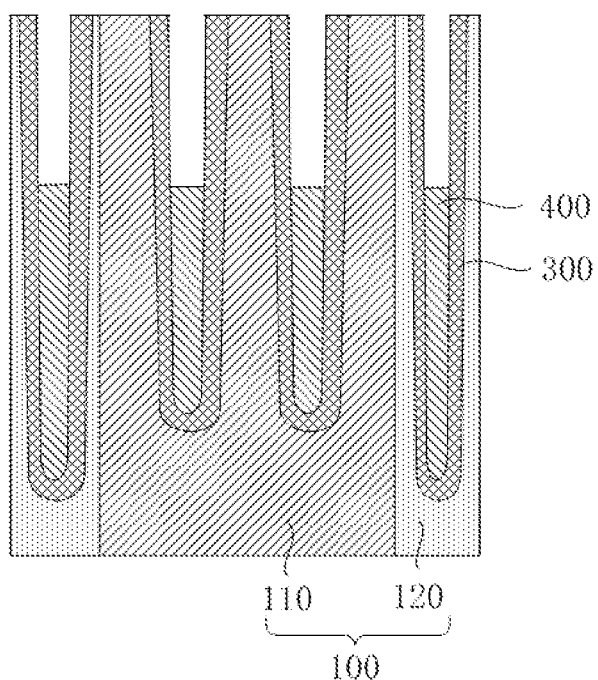
FIG. 12 illustrates another schematic cross-sectional diagram of a semiconductor structure after etching the second conductive layer by a second etching process provided by an embodiment of the present disclosure.

Referring to FIGS. 11 and 12, the remaining part of the first conductive layer 400 is etched continuously by a second etching process, to remove the part of the first conductive layer 400 located in the trenches 200 to the target depth, as shown at L in FIG. 11. It is to be understood that after part of the first conductive layer 400 is removed by the first and second etching processes, the remaining first conductive layer 400 is located at the target depth of the trenches 200. The height of the first conductive layer 400 is further reduced by the second etching process.

In some possible embodiments, the first etching process is the same as the second etching process. As an example, both of the first etching process and the second etching process are a dry etching process or a wet etching process. The process parameters of the first etching process and the second etching process may be the same or different. For example, the etching rate of the second etching process is less than the etching rate of the first etching process. The etching depth of the first etching process is greater than that of the second etching process, that is, the first conductive layer 400 to be removed is removed by two etching processes Large part of the first conductive layer 400 to be removed is removed by the first etching process, and small part of the first conductive layer 400 to be removed is removed by the second etching process, so as to facilitate to stop etching, thereby reducing over-etching of the first conductive layer 400 and damage to the first insulating layer 300.

In some other possible embodiments, the first etching process is different from the second etching process. For example, the first etching process is wet etching, while the second etching process is dry etching; or the first etching process is dry etching, while the second etching process is wet etching.

In a preferred embodiment, the first etching process is dry etching, and the second etching process is wet etching. With this arrangement, dry etching, which has good consistency, improves the accuracy of the pattern. After the part of the first conductive layer 400 located on the substrate 100 and at the bottom of the trenches 200 is removed by dry etching, the remaining first conductive layer 400 is formed into multiple strips spaced apart from each other. The multiple strips of the first conductive layer 400 are substantially flush or have a height difference within a preset range. The depth of the multiple strips of the first conductive layer 400 does not change much. Wet etching has a better selectivity ratio. When etching the first conductive layer 400 is continued by wet etching, damage to the exposed substrate 100 and sidewalls of the trenches 200 can be avoided, that is, the damage to the substrate 100 and the first insulating layer 300 is small, and the thickness of the first insulating layer 300 close to the first conductive layer 400 after etching can be ensured, thereby ensuring the insulation performance between the second conductive layer 500 and the substrate 100 after the subsequent formation of the second conductive layer 500, and reducing or avoiding the gate induced drain leakage phenomenon.

Specifically, the first etching process includes dry etching. The etching depth of the fry etching is 40-50 nm. With this arrangement, the etching depth of dry etching is deeper, so that the depth difference of multiple strips of the first conductive layer 400 can be minimized as much as possible, and the depth change between the multiple strips of the first conductive layer 400 can be avoided from being too large. The source power of the dry etching process ranges from 200 W to 300 W, and the bias power ranges from 100 W to 200 W. The source power refers to the power applied to the upper electrode of the etching machine, and the bias power refers to the power applied to the lower electrode of the etching machine. By adjusting the bias power, the directivity of the etching gas can be controlled, and the depth of dry etching can be changed.

During the dry etching of the first conductive layer 400, the etching gas includes at least one of argon, nitrogen, chlorine or nitrogen trifluoride. As an example, the volume flow rate of argon is 100-300 sccm, the volume flow rate of nitrogen is 10-40 sccm, the volume flow rate of chlorine is 50-100 sccm, and the volume flow rate of nitrogen trifluoride is 10-40 sccm. In a preferred embodiment, the volume flow rate of argon is 200 sccm, the volume flow rate of nitrogen is 20 sccm, the volume flow rate of chlorine is 80 sccm, and the volume flow rate of nitrogen trifluoride is 20 sccm, the source power is 250 W and the bias power is 150 W.

The second etching process includes wet etching. The etching depth of the wet etching is 10-15 nm. The wet etching has a small etching depth, which mainly removes the part of the first conductive layer 400 located in the middle of the trenches 200. The space formed after removing this part of the first conductive layer 400 can be used to accommodate the second conductive layer 500 (referring to FIGS. 15 and 16). This space is formed by wet etching; by doing so, the damage to the first insulating layer 300 on the sidewall of the space is less, thereby ensuring the insulation between the second conductive layer 500 and the active areas 110 and reducing gate induced drain leakage.

The etchant used in wet etching may be sulfuric peroxide mixture (SPM), which has strong oxidation. Specifically, the etchant used in wet etching may include sulfuric acid with 96% of mass fraction and hydrogen peroxide with 30% of mass fraction. The volume ratio of sulfuric acid to hydrogen peroxide in the etchant is 5:1-8:1. In a preferred embodiment, during the wet etching, the volume ratio of sulfuric acid with 96% of mass fraction to hydrogen peroxide with 30% of mass fraction in the etchant is 6:1.

In other embodiments of the present disclosure, referring to FIGS. 13-16, the method further includes: a second conductive layer 500 and a protective layer 600 are sequentially formed on the first conductive layer 400 etched in the trenches 200. The second conductive layer 500 covers the first conductive layer 400, and the protective layer 600 covers the second conductive layer 500.

Figure 13:
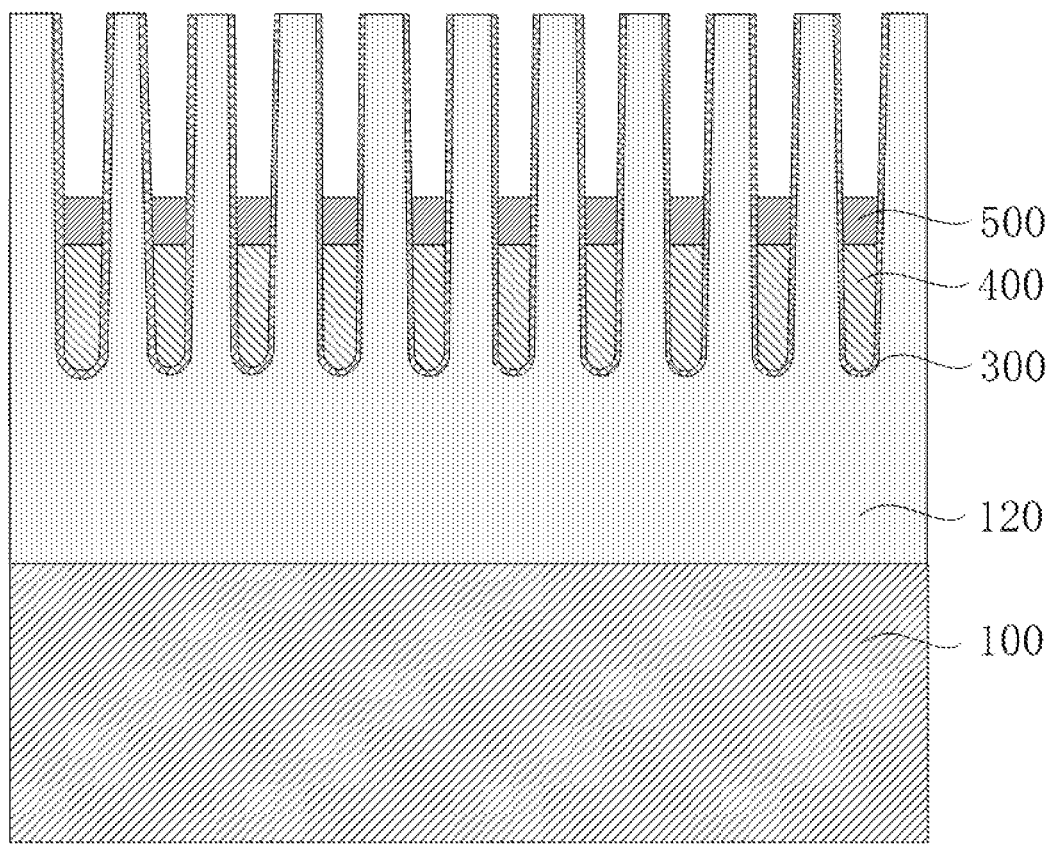
FIG. 13 illustrates a schematic cross-sectional diagram of a semiconductor structure after forming a second protective layer provided by an embodiment of the present disclosure.
Figure 14:
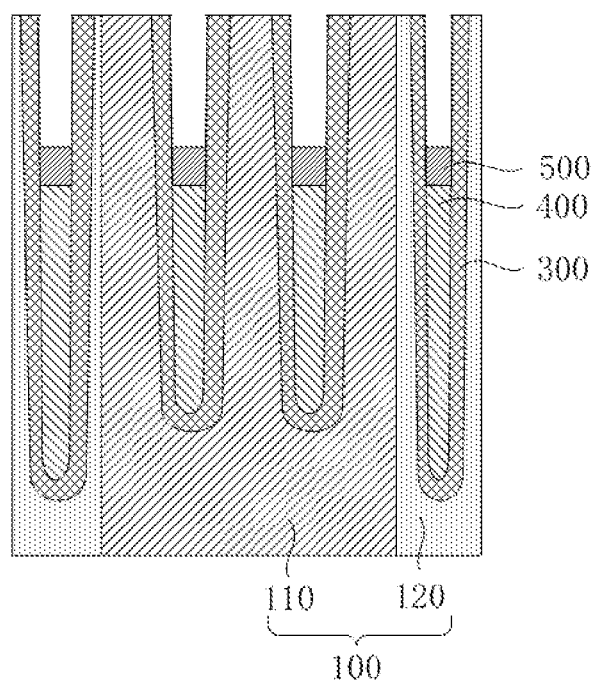
FIG. 14 illustrates another schematic cross-sectional diagram of a semiconductor structure after forming a second conductive layer provided by an embodiment of the present disclosure.

Specifically, referring to FIGS. 13 and 14, after part of the first conductive layer 400 is removed by the first and second etching processes and the part of the first conductive layer 400 located at the bottoms of the trenches 200 is retained, there still be some space in the trenches 200 being exposed. A second conductive layer 500 and a protective layer 600 are formed in the space exposed in the trenches 200. The second conductive layer 500 covers the first conductive layer 400, and the protective layer 600 covers the second conductive layer 500. That is, a first insulating layer 300 is formed on sidewalls and bottoms of the trenches 200, and a first conductive layer 400, a second conductive layer 500 and a protective layer 600 are stacked subsequently in areas enclosed by the first insulating layer 300. These four layers fill the trenches 200.

The material of the second conductive layer 500 includes a semiconductor material or a doped semiconductor material. For example, the material of the second conductive layer 500 may be polysilicon or doped polysilicon. With this arrangement, where the first conductive layer 400 is a metal conductive layer, the resistance can be reduced by taking advantage of the low work function of polysilicon, that is, the resistance of the stack formed by the polysilicon-metal conductive layer is lower than that of the metal conductive layer with the same height. Where the material of the second conductive layer 500 is polysilicon, the thickness of the second conductive layer 500 is smaller than the thickness of the first conductive layer 400 to prevent an increase in the depth-width ratio and/or capacitance of the stack formed by the polysilicon-metal conductive layer. The material of the protective layer 600 may be silicon nitride or silicon oxynitride. The protective layer isolates and protects the second conductive layer 500 to reduce or avoid the oxidation of the second conductive layer 500.

The second conductive layer 500 and the protective layer 600 may be formed by a deposition process. As an example, the second conductive layer 500 is deposited and formed on the first conductive layer 400 and the substrate 100, The part of the second conductive layer 500 located on the substrate 100 and within the trenches 200 are removed by etching. That is, the second conductive layer 500 is formed by deposition and etching back. The protective layer 600 is deposited and formed on the second conductive layer 500 and the substrate 100. The part of the protective layer 600 on the substrate 100 is removed by an etching or planarization process.

Preferably, the part of the protective layer 600 on the substrate 100 is removed by chemical mechanical polishing. With this arrangement, after the part of the protective layer 600 on the substrate 100 is removed, further downward polishing can be carried out to remove part of the substrate 100 and part of the protective layer 600, so as to expose the active areas 110 in the substrate 100 and facilitate electrical connection of the active areas 110 with other structures. The protective layer 600 may be flush with the active areas 110 to provide a relatively flat surface to facilitate the formation of other structures on the protective layer 600 and the active areas 110.

Figure 15:
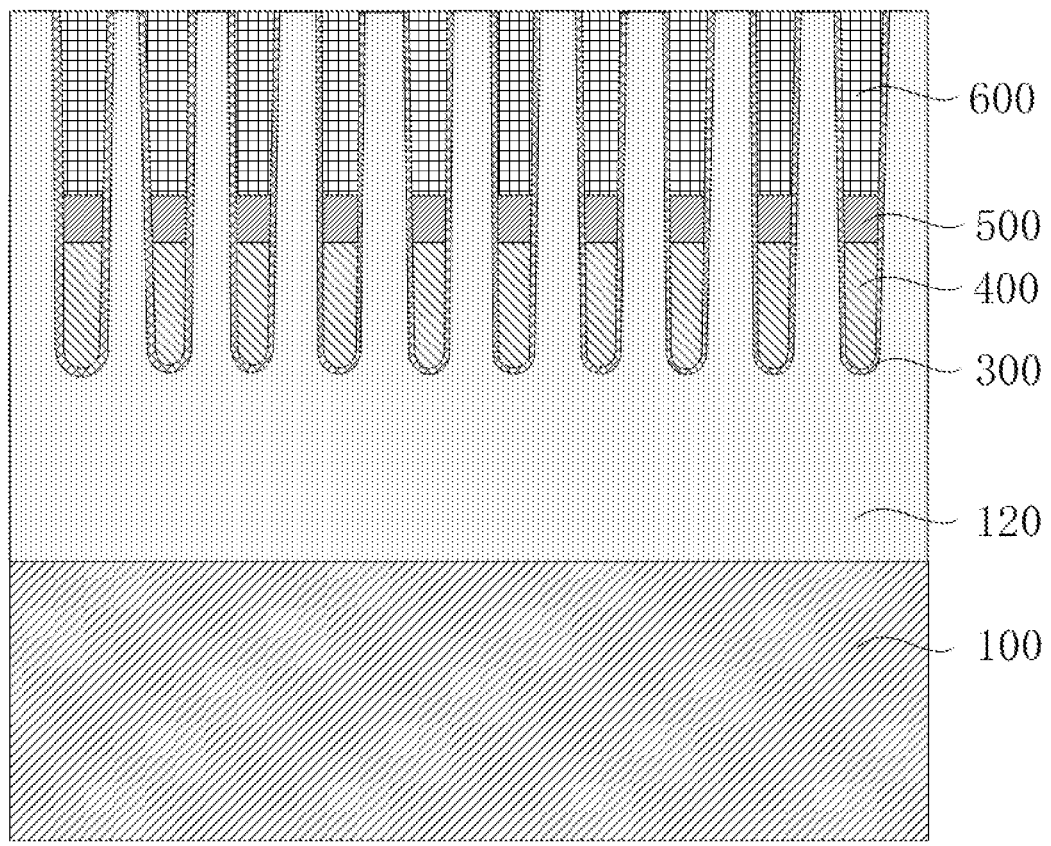
FIG. 15 illustrates a schematic cross-sectional diagram of a semiconductor structure after forming a protective layer provided by an embodiment of the present disclosure.
Figure 16:
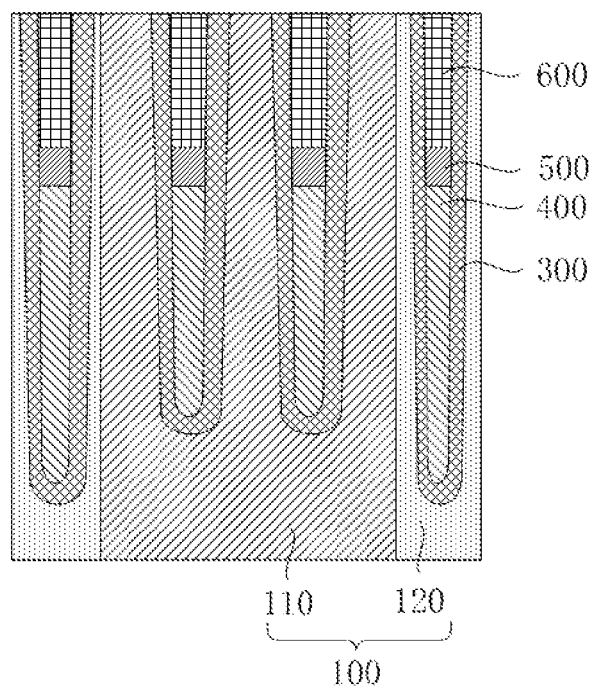
FIG. 16 illustrates another schematic cross-sectional diagram of a semiconductor structure after forming a protective layer provided by an embodiment of the present disclosure.

Referring to FIGS. 15 and 16, the first insulating layer 300 is formed on sidewalls and bottoms of the trenches 200. The first conductive layer 400, the second conductive layer 500 and the protective layer 600 are formed in areas enclosed by the first insulating layer 300. The first conductive layer 400, the second conductive layer 500 and the protective layer 600 are stacked subsequently along the direction from the bottom of the trenches 200 to the opening, in which the first conductive layer 400 is located on a side of the second conductive layer 500 close to the bottom of the trenches 200.

As shown in FIGS. 15 and 16, part of the first insulating layer 300 serve as a gate dielectric layer. The gate dielectric layer may be divided into three parts, which are a top gate dielectric layer, a middle gate dielectric layer, and a bottom gate dielectric layer. The top gate dielectric layer is in contact with the protective layer 600, the middle gate dielectric layer is in contact with the second conductive layer 500, and the bottom gate dielectric layer is in contact with the first conductive layer 400. The insulation performance of the middle gate dielectric layer affects the threshold voltage Vt and the gate induced drain leakage, and the insulation performance of the bottom gate dielectric layer affects the source leakage current Ids. In the embodiment of the present disclosure, when the first conductive layer 400 is etched to the initial depth by the first etching process, the bottom gate dielectric layer and the middle gate dielectric layer are not etched, which ensures their insulation performance. When the first conductive layer 400 is etched to the target depth by the second etching process, the bottom gate dielectric layer is still not etched, and its insulation performance is good. By adjusting the second etching process, such as process parameters, the damage to the middle gate dielectric layer is reduced to ensure its insulation performance.

In the method for manufacturing a semiconductor structure provided by the present disclosure, trenches 200 are formed in a substrate, and the first insulating layer 300 is formed on sidewalls and bottoms of the trenches 200, and the first conductive layer 400 is formed on the surface of the first insulating layer 300, then part of the first conductive layer 400 is removed to an initial depth by a first etching process and the remaining part of the first conductive layer 400 is removed to a target depth by a second etching process. The first conductive layer 400 is etched to a target depth through at least two etching processes. By controlling the first etching process and/or the second etching process, the damage to the first insulating layer 300 can be reduced during the etching of the first conductive layer 400, thereby ensuring the thickness of the first insulating layer 300, and reducing or avoiding the gate induced drain leakage phenomenon, thus improving the yield of semiconductor structure.

Various embodiments or implement modes in this specification are described in a progressive manner and each embodiment focuses on differences from other embodiments. Same and similar parts between the embodiments can be referred to each other. The description of the reference terms "one embodiment", "some embodiments", "illustrative embodiments", "example", "specific example", "some examples" or the like refers to that specific features, structures, materials, or characteristics described in connection with the embodiment or example are included in at least one embodiment or example of the present disclosure. In this specification, illustrative representations of the above terms do not necessarily refer to the same embodiments or examples. Further the described specific features, structures, materials or characteristics may be combined in a suitable manner in any one or more embodiments or examples.

Finally, it should be noted that, the above embodiments are only used to illustrate the technical solution of the present disclosure, not limitation; although the present disclosure has been described in detail with reference to the preceding embodiments, it should be understood by those of ordinary skill in the art that the technical solution described in the preceding embodiments can still be modified or some or all of the technical features thereof can be equivalently replaced; while these modifications or replacements are not intended to make the nature of the corresponding technical solution depart from the scope of the technical solution of the embodiments of the present disclosure.

What is claimed is:

1. A method for manufacturing a semiconductor structure, comprising:
    forming a plurality of trenches spaced apart from each other and extending in a first direction in a substrate, and forming a first insulating layer on sidewalls and bottoms of the trenches;
    forming a first conductive layer on a surface of the first insulating layer;
    removing part of the first conductive layer to an initial depth by a first etching process, wherein the first etching process is a multi-step process comprising a first dry etching process and a second dry etching process, and wherein an etching rate of the second dry etching process is less than an etching rate of the first dry etching process; and
    removing remaining part of the first conductive layer to a target depth by a second etching process, wherein the second etching process comprises a wet etching process and wherein an etchant adopted in the wet etching process comprises a sulfuric peroxide mixture.

2. The method according to claim 1, wherein the forming a first conductive layer on a surface of the first insulating layer comprises:
    depositing the first conductive layer on the surface of the first insulating layer and the substrate, the first conductive layer filling the trenches on which the first insulating layer is formed and covering the substrate.

3. The method according to claim 2, wherein the first conductive layer comprises a metal conductive layer.

4. The method according to claim 2, wherein removing part of the first conductive layer to an initial depth by a first etching process comprises:
    dry etching the first conductive layer to completely remove the first conductive layer on the substrate and to remove the first conductive layer in the trenches to the initial depth.

5. The method according to claim 4, wherein an etching depth of the dry etching process is 40-50 nm.

6. The method according to claim 4, wherein source power of the dry etching process ranges from 200 W to 300 W, and bias power of the dry etching process ranges from 100 W to 200 W.

7. The method according to claim 4, wherein while dry etching the first conductive layer, an etching gas comprises at least one of argon, nitrogen, chlorine, or nitrogen trifluoride.

8. The method according to claim 7, wherein volume flow rate of argon is 100-300 sccm, volume flow rate of nitrogen is 10-40 sccm, volume flow rate of chlorine is 50-100 sccm, and volume flow rate of nitrogen trifluoride is 10-40 sccm.

9. The method according to claim 1, wherein the etchant adopted in the wet etching process comprises sulfuric acid with 96% of mass fraction and hydrogen peroxide with 30% of mass fraction.

10. The method according to claim 9, wherein a volume ratio of sulfuric acid to hydrogen peroxide in the etchant is 5:1-8:1.

11. The method according to claim 9, wherein an etching depth of the wet etching process is 10-15 nm.

12. The method according to claim 1, wherein the method further comprises: sequentially forming a second conductive layer and a protective layer on the first conductive layer etched in the trenches, the second conductive layer covering the first conductive layer and the protective layer covering the second conductive layer.

13. The method according to claim 12, wherein a material of the second conductive layer comprises a semiconductor material or a doped semiconductor material.

14. The method according to claim 1, wherein the substrate comprises a plurality of active areas spaced apart from each other and shallow groove isolation structures for isolating each of the active areas;
   the forming a plurality of trenches spaced apart from each other and extending in a first direction in a substrate, and forming a first insulating layer on sidewalls and bottoms of the trenches comprises:
   etching the active areas and the shallow trench isolation structures to form the trenches; and
   depositing the first insulating layer on the sidewalls and the bottoms of the trenches.

15. A semiconductor structure, prepared by the method according to claim 1.

16. The method according to claim 1, wherein the first conductive layer includes a metal conductive layer which is a single layer or comprises multiple layers.

17. The method according to claim 12, wherein a space formed by the wet etching process is used to accommodate the second conductive layer.

18. The method according to claim 1, before forming a plurality of trenches spaced apart from each other and extending in a first direction in a substrate, the method further comprises:
   forming a second insulating layer on a surface of the substrate by a thermal oxidation process.

* * * * *